United States Patent [19]
Stengel et al.

[11] Patent Number: 5,541,554
[45] Date of Patent: Jul. 30, 1996

[54] MULTI-MODE POWER AMPLIFIER

[75] Inventors: Robert E. Stengel, Pompano Beach; Scott A. Olson, Sunrise, both of Fla.

[73] Assignee: Motorola, Inc., Schaumburg, Ill.

[21] Appl. No.: 399,019

[22] Filed: Mar. 6, 1995

[51] Int. Cl.$^6$ .............................. H03F 3/68; H03F 3/24
[52] U.S. Cl. .......................... 330/51; 330/295; 455/93
[58] Field of Search ........................ 330/51, 124 R, 330/295; 455/93, 116, 127

[56] References Cited

U.S. PATENT DOCUMENTS

| | | | |
|---|---|---|---|
| 4,598,252 | 7/1986 | Andricos | 330/51 |
| 4,755,769 | 7/1988 | Katz | 330/51 X |
| 5,256,987 | 10/1993 | Kibayashi et al. | 330/51 X |
| 5,276,912 | 1/1994 | Siwiak et al. | 455/73 |
| 5,276,917 | 1/1994 | Vanhanen et al. | 455/89 |
| 5,361,403 | 11/1994 | Dent | 455/74 |

FOREIGN PATENT DOCUMENTS 3018590  9/1993  WIPO ........................ 455/93

*Primary Examiner*—James B. Mullins
*Attorney, Agent, or Firm*—Andrew S. Fuller

[57] ABSTRACT

An amplifier (100) has first and second operation modes. The amplifier (100) includes an amplifier input portion (110) and an amplification gain stage. The amplification stage has two gain paths (120, 140) coupled in parallel to the amplifier input portion (110). At least one of the gain paths (120) has an amplification component (121) that in part forms a switch to select between the first and second operation modes.

14 Claims, 4 Drawing Sheets

MULTI-MODE POWER AMPLIFIER

TECHNICAL FIELD

This invention relates in general to power amplifiers, and more particularly, to high-efficiency power amplifiers with variable output power.

BACKGROUND OF THE INVENTION

Many radio communication devices must support signal transmissions with different transmit power requirements. For example, a radio may have dual mode operation in which one mode requires signal transmission by frequency modulation (FM), and another mode requires signal transmissions by amplitude modulation (AM), or variations thereof, such as quadrature amplitude modulation (QAM). In another example, the transmitter must be able to support transmissions of signals using a particular modulation scheme at various output power levels. Generally, it is desirable to have the transmitters of these multi-mode radios to be capable of operating efficiently, regardless of operating mode.

A typical radio transmitter employs a radio frequency (RF) amplifier to amplify outbound signals for radiation by an antenna. The efficiency of the RF amplifier is a significant contributor to the overall efficiency of the transmitter. RF power amplifiers are generally designed to provide maximum efficiency at peak output power. When the output power level is adjusted to values below the peak output power, such as by varying the input drive level to the power amplifier, a significant efficiency reduction occurs. This is often the case regardless of the class of amplifier involved. As efficiency considerations are of primary concern in many of today's RF communications applications, the provision of an efficient power amplification system for a radio transmitter has received much attention in the art.

FIG. 1 is a block diagram of prior art amplification circuitry 10 that attempts to address the problem of transmitting at different output levels while maintaining high efficiency transmissions. In the amplification circuitry 10 depicted, two separate amplifiers 13, 23 are coupled to an input source 12, and an RF switch, comprising pin diodes 15, 25, is used to select the amplifier 13, 23 best suited for a given function. Direct current (DC) is used as a bias to enable a selected amplifier 13, 23 to present an output 32 for routing to an antenna (not shown). In operation, the pin diodes are biased "on" to select the first amplifier and to establish an RF path from the first amplifier to the antenna. The diodes are reversed biased "off" to select the second amplifier, and to form an RF path from the second amplifier to the antenna. Reverse biasing is necessary on the diodes to reduce the RF signal distortion, as the "off" diodes are susceptible to large RF signal levels. The use of separate amplifiers increases the overall cost, size, and weight of the radio transmitter.

Another approach which can be found in the prior art includes the use of cascaded amplification stages, one or more of which may be switched out, such as by using a diode switch, to effect different power output levels. An example such a variable power amplifier is described by U.S. Pat. No. 5,276,917, issued on Jan. 4, 1994, to Vanhanen et al. for a Transmitter Switch-On In A Dual-Mode Mobile Phone. Yet another approach selects between impedance networks which are selectively attached to an amplifier output in order to vary the overall output signal level. An example of this approach is described by U.S. Pat. No. 5,361,403, issued on Nov. 1, 1994, to Dent for an AM-FM Transmitter Power Amplifier. Generally, the various RF signal paths are selected using RF switching employing diodes and the like.

The use of separate amplifiers to achieve a multiple output power level requirement adds unnecessary costs and size to a radio transmitter. Many of the other approaches to multiple amplification output power level at high efficiency depend on the use of RF switching, which may be generally susceptible to leakage at a high RF level, resulting in potential distortion in the output signal. It is desirable to have a radio transmitter with power amplification which do not suffer from the above-mentioned problems. Therefore, a new approach to multi-mode power amplifier design is desired in the art.

DETAILED DESCRIPTION OF THE PREFERRED EMBODIMENT

Figure 1:
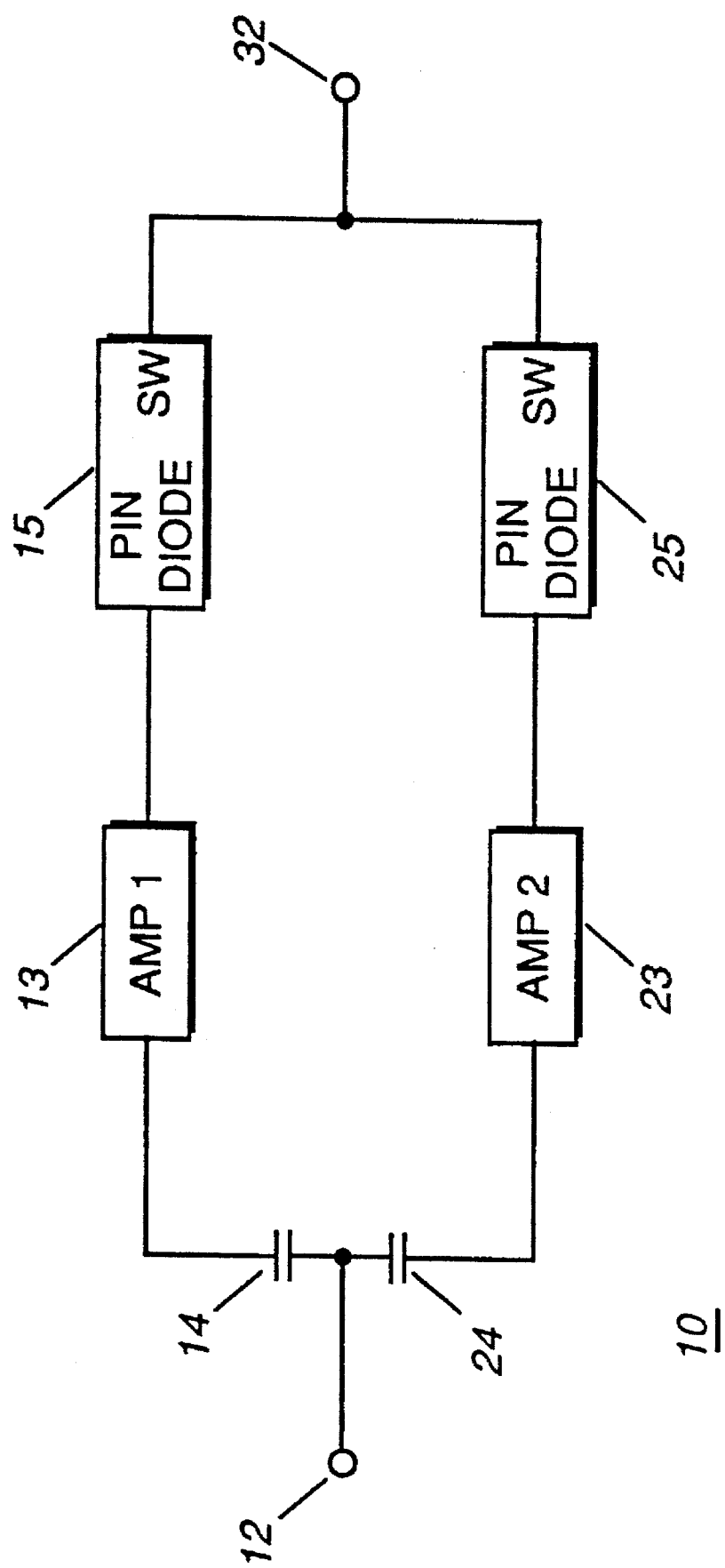
FIG. 1 is a block diagram of prior art amplification circuitry using two independent power amplifiers coupled to a common input signal.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for a multi-mode power amplifier which has operating modes corresponding to different levels of power output requirements. The multi-mode amplifier has at least two amplification gain paths coupled in parallel to an input portion of the amplifier. The output of the gain paths are combined at a common node to present the output for a particular stage of the amplifier. An active amplification component within at least one of the gain paths operates as part of a switch to select from among the operation modes of the amplifiers. In the preferred embodiment, an impedance transformation network is provided between the active amplification component and the common node. A low impedance termination to electrical ground is selectively coupled to the active amplification component. The impedance matching network and the low impedance termination to electrical ground are also part of the switch for selecting from among the operation modes of the amplifier. A particular gain path is switched out of the amplifier when the low impedance termination to ground is presented at the active amplification component, which simultaneously causes a high impedance at the common node for the particular gain path. Thus, a highly effective RF switch which is not susceptible to RF power desense is accomplished. Moreover, this RF switch uses components integral to the amplification function of the circuitry thereby reducing the space and costs associated with separate components used in the prior art for this function.

Figure 2:
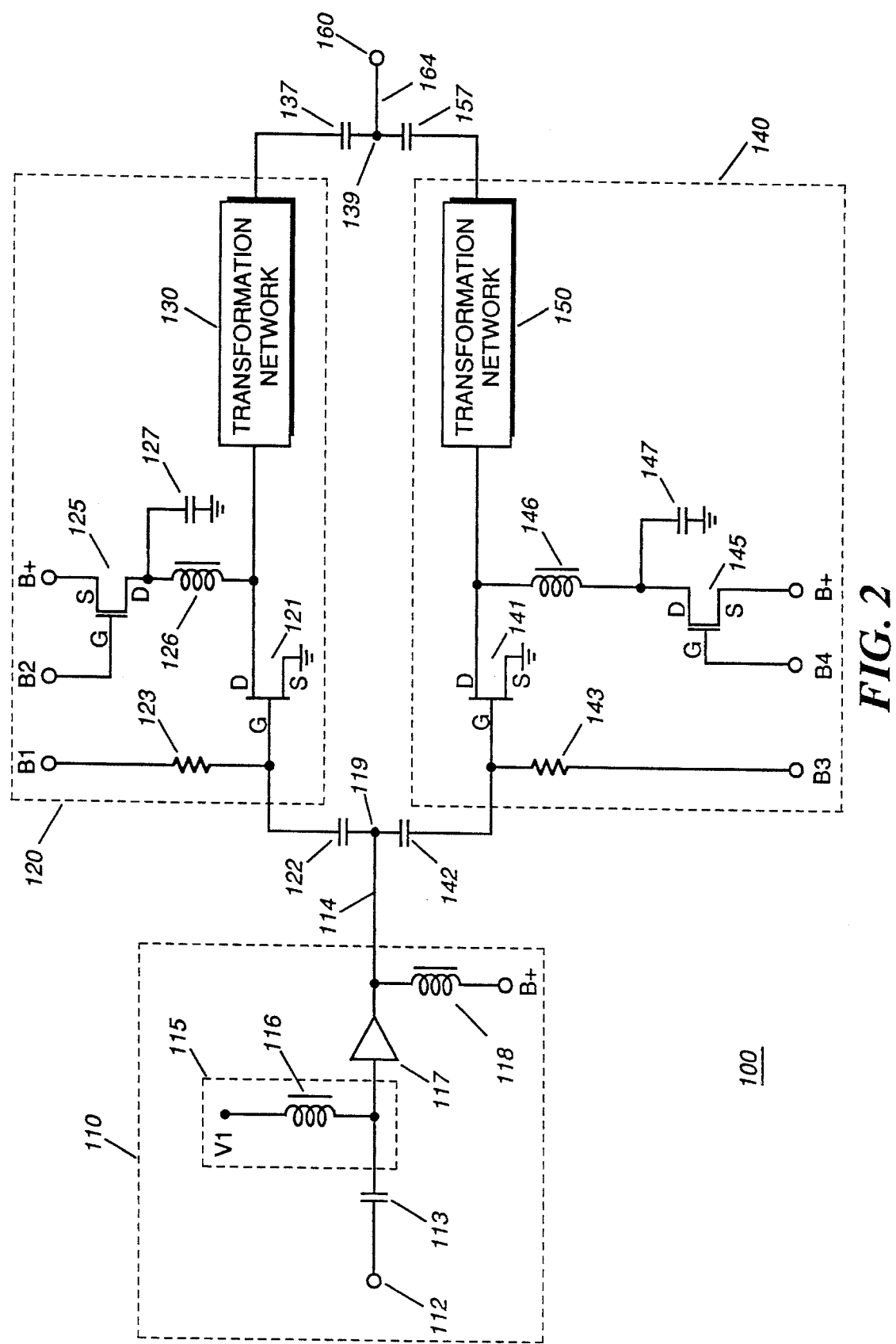
FIG. 2 is a schematic view of a dual mode amplifier, in accordance with the present invention.

Referring to FIG. 2, a schematic view of a dual mode amplifier 100 is shown, in accordance with the present invention. The dual mode power amplifier 100 includes an amplifier input portion 110, and two amplifier gain paths 120, 140 coupled in parallel to the amplifier input portion 110. The amplifier input portion 110 includes an RF input port 112 coupled in series to an amplifier driver or gain stage 117. An amplifier switch 115 enables the amplifier driver 117. DC voltage to power the amplifier driver 117 is supplied through RF chokes 116, 118. A capacitor 113 decouples the RF input port 112 from the DC voltage supplied to the amplifier driver 117. The amplifier input portion 110 may include only the RF input port when no pre-amplification is needed.

In the preferred embodiment, the gain paths 120, 140 are similarly constructed and are implemented as the final gain stage of an amplification circuit. An active amplification component 121, 141 provides amplification for each gain path, 120, 140. In the preferred embodiment, the active amplification component 121, 141 is a RF power transistor such as a depletion mode gallium arsenide metal semiconductor field-effect transistor (MESFET) or heterojunction field-effect transistor (HFET). The input of the power transistor, i.e., gate G of the MESFET 121, 141, is coupled to the amplification input portion 110 via a common node 119. Capacitors 122, 142, 137, 157 block DC coupling between the gain paths 120, 140, and between the gain paths 120, 140 and the amplification input portion 110. A DC bias voltage B+ presented across a resistor 123, 143, provides a biasing current to the gate of the power transistor 121, 141. A metal-oxide semiconductor field-effect transistor (MOSFET) pass transistor 125, 145 is coupled to the drain D or output of the power transistor. Preferably, the pass transistor is a metal-oxide semiconductor field-effect transistor P-channel switch device. An RF choke 126 inhibits RF coupling between the output of the power transistor and the pass transistor. RF chokes 126, 146, and RF bi-pass capacitors 127, 147 provide RF decoupling and DC coupling to power transistors 121, 141. The pass transistor 125, 145 provides the DC voltage bias for the power transistor, which amplifies an input signal from the amplification input portion 110.

An impedance transformation network 130 is coupled to the output, i.e., the drain of the power transistor 121, 141. The impedance transformation network 130 has a characteristic impedance selected to transform two times RF output load impedance down to an impedance for power load matching of the active devices, i.e., the power transistors. Additionally, the impedance transformation network 130 operates to provide a quarter wave length transmission phase shift. In the preferred embodiment, the impedance matching network is a quarter wavelength transmission line. However, the transformation network can be formed using distributed or discrete elements. The impedance matching network of both gain paths are coupled at the common node 139, and together function as a modified Wilkinson combiner to combine signals from both gain paths 120, 140 to present an amplified signal 164 at output port 160. The active devices 121, 141 of the gain paths 120, 140 are switched between linear and constant envelope operations by the modified Wilkinson combiner, and by the pass transistor as a supply side switch device.

The multi-mode amplifier 100 of the preferred embodiment can be configured to operate in at least two distinct modes. In a first mode of operation, the amplifier 100 generates its highest peak output power when the amplification devices 121, 141 of both gain paths 120, 140 are active, and their outputs combined at the common node using the impedance transformation network 130, 150. In the first mode, an input signal 114 supplied via the input portion 110 is amplified by both gain paths 120, 140 to present the amplified output signal 164. With both gain paths active, the power amplifier 100 is capable of peak power output with linear performance. In a second mode of operation, the DC bias voltage B+ supplying one of the active components, such as power transistor 121, is turned off with the selection of an appropriate voltage level B2 to the gate of the pass transistor 125. Accordingly, B2 is a control signal that effectively disconnects the power transistor 121 from its DC power source B+ to select between operating modes. Additionally, the DC bias B1 provided to the gate of the power transistor 121 through resistor 123 is adjusted to provide a low impedance termination to electrical ground from its drain, D, to its source, S, terminals. The low impedance to electrical ground at the output of the power transistor 121 translates into a very high impedance at the common node 139 by the impedance transformation network 130. As a result, the RF output power is reduced by an amount corresponding to the amplification of the power transistor 121. Additional RF power output reduction is caused by the impedance load shift at the common node. Since the active devices are operated in peak power conditions in both operating modes, the amplification efficiency is maintained at maximum.

Alternatively, the amplifier 100 may be constructed with dissimilar amplification circuitry and transformation matching in each gain path. For example, transistor 141 may have different characteristics than transistor 121. A third mode of operation could then be obtained, still using only two gain paths, by switching out transistor 141, using B3 and B4, rather than transistor 121 as described earlier.

In the preferred embodiment, the dual-mode amplifier is implemented on alumina substrate. The use of multiple gain paths does not substantially increase the die area required to implement the amplifier. Rather, the die area is a function of the total output power required for the RF devices and the maximum current for the pass transistors. Splitting the peak power between two or more devices reduces the size of the devices by a similar factor. Moreover, multiple active devices can be implemented on a single die by isolating gate and drain connections.

Figure 3:
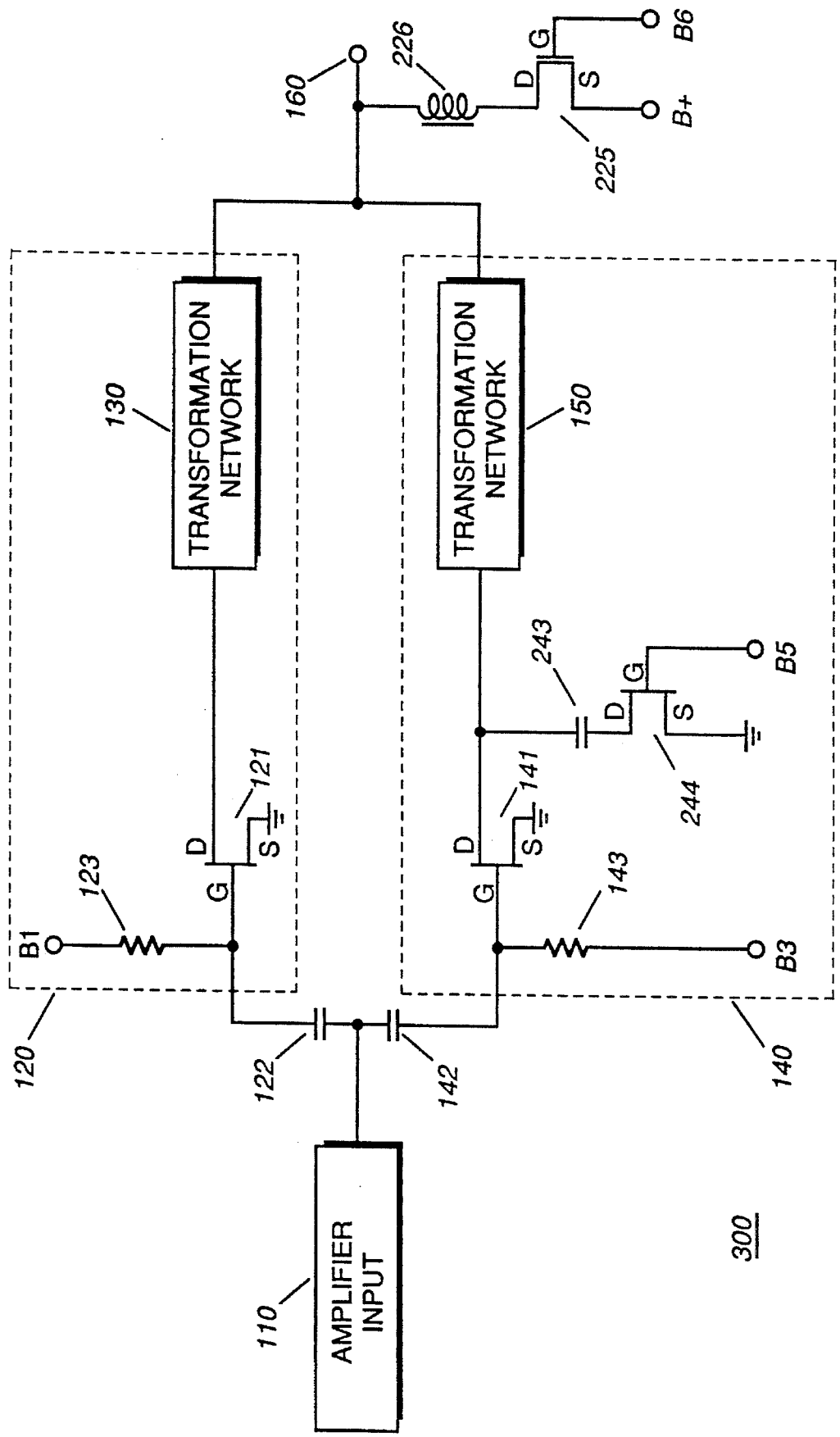
FIG. 3 is a schematic view of a second embodiment of a dual mode amplifier in accordance with the present invention.

FIG. 3 is a schematic diagram of a second embodiment of the multi-mode amplifier 300, in accordance with the present invention. Like reference numerals are carried forward and only the differences between the power amplifier of FIG. 3 and the power amplifier of FIG. 2 are described. In this embodiment, a MOSFET common pass transistor 225 supplies the DC bias B+ through RF choke 226 under control of gate voltage B6 for both gain paths 120, 140. An additional MESFET RF device 244 is AC coupled to the drain of the power transistor 141 through a blocking capacitor 243. In one operating mode, such as for FM operation, power transistor 14 1 is turned off by varying the gate voltage B3. The RF device 244 is turned on by varying the gate voltage B5 to provide a low impedance electrical coupling to ground at the transformation network.

Figure 4:
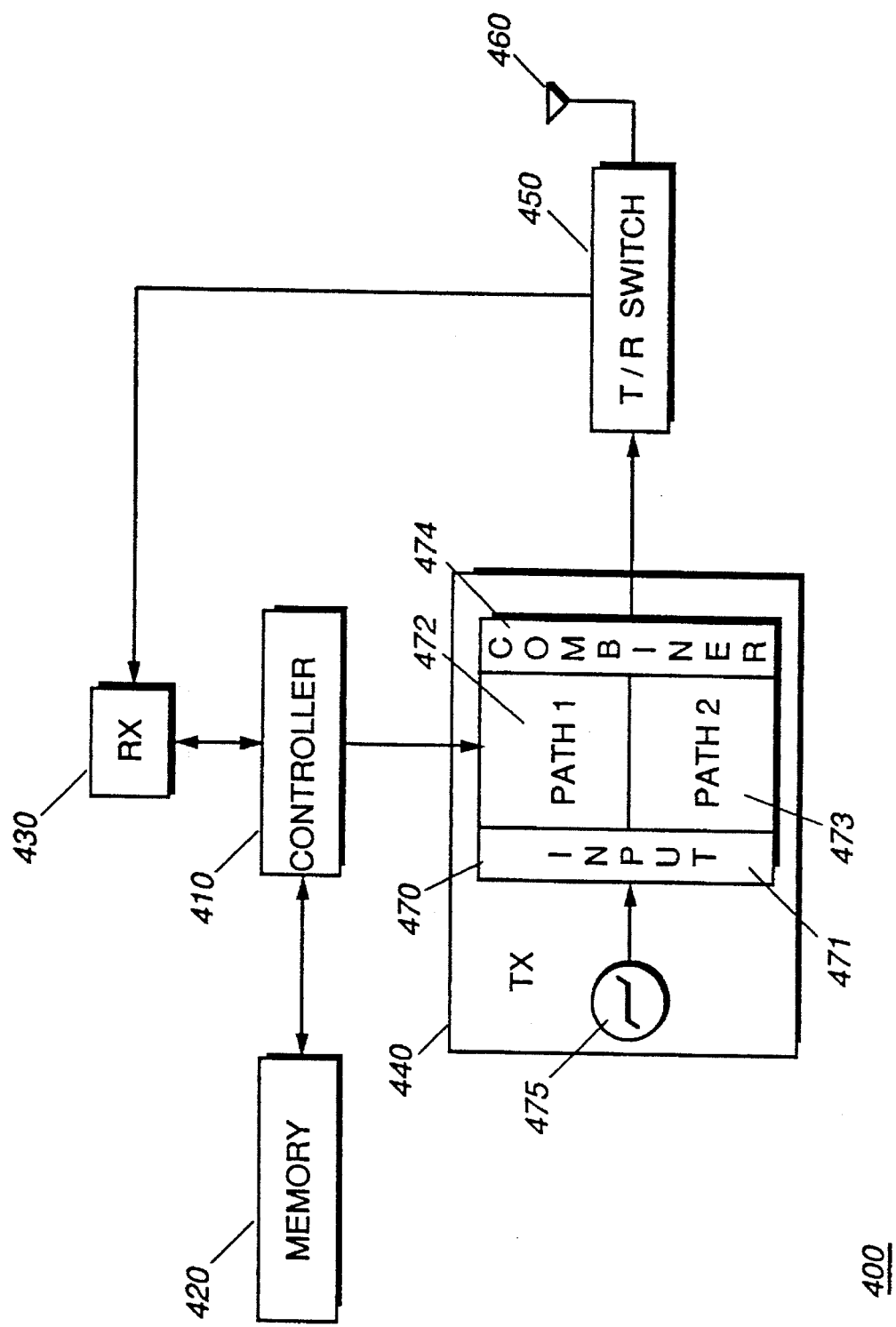
FIG. 4 is a block diagram of a radio communication device employing the dual-mode amplifier of FIG. 2, in accordance with the present invention.

FIG. 4 is a block diagram of a communication device 400 that supports transmissions in an FM operating mode, and in a QAM operating mode, in accordance with the present invention. The communication device 400 has a controller 410 to provide operational control for the functions of the communication device 400, including the selection of transmit power output level corresponding to the operating modes. The operation of the communication device 400 is governed by a controller 410 under instructions stored in an electrically coupled memory 420. Communication device capabilities include receive and transmit operations. The controller 410 is coupled to the receiver 430, and operates to control a receiver 430 to selectively receive signals. For receive operations, a transmit/receive switch 450 is engaged to selectively couple an antenna 460 to the receiver 430.

The controller 410 is also coupled to a transmitter 440, and operatively controls the transmitter 440 during transmissions. For transmit operations, the transmit/receive switch 450 is engaged so as to couple the transmitter to the antenna 460 through a dual-mode radio frequency (RF) power amplifier 470 as taught by the present invention. The power amplifier 470 includes a signal source 475 coupled to an input portion 471, which in turn is coupled to two parallel gain paths 472, 473, which in turn are coupled to a combiner 474. When in operating in the QAM mode, the controller 410 instructs the RF power amplifier to activate both gain paths 472, 473, and to combine the signals to provide the amplified output. When operating in the FM mode, the controller 410 deactivates one of the gain paths 472,473 to reduce the power output level of the RF power amplifier. Signals amplified by the RF power amplifier 470 are radiated through the antenna 460.

The present invention provides significant advantages over prior art amplification circuitry. For example, a multi-mode flexible power amplifier providing efficient power output at various levels can be constructed, according to the present invention, within the same physical area ordinarily required to implement a prior art power amplifier having a particular output power level. The problem of RF signal distortion as a result of the susceptibility of pin diode switches to large RF signal levels have been substantially reduced. Moreover, significant elements within the amplification gain paths of the amplifier are reused for switching and combining purposes, to reduce the number of circuit elements, and to reduce the physical area required to implement the amplifier.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An amplifier having a first operation mode and being responsive to a control signal to select a second operation mode, the amplifier comprising:
   an amplifier input portion;
   an amplification gain stage, comprising:
      a first gain path coupled to the amplifier input portion;
      a second gain path coupled in parallel with the first gain path to the amplifier input portion, the second gain path comprising an amplification component, the amplification component having a selectively enabled radio frequency (RF) low impedance termination to ground;
   an impedance transformation network coupled to the amplification component; and
   RF switch formed from the application component and the impedance transformation network, the RF switch being responsive to the control signal to enable the RF low impedance termination to ground at the amplification component such that the impedance transformation network presents a high impedance, thereby disabling the second gain path to select the second operation mode.

2. The amplifier of claim 1, wherein the amplification component comprises a power transistor.

3. The amplifier of claim 2, wherein the low impedance termination to ground comprises the power transistor.

4. The amplifier of claim 3, further comprising a pass transistor that provides a direct current bias to the power transistor in response to the control signal.

5. The amplifier of claim 1, wherein the transformation network comprises a quarter wavelength transmission line.

6. A multi-mode amplifier having an amplifier input portion for providing an input signal, and an amplification stage responsive to a control signal to select between first and second operation modes to provide an output signal, the amplification stage comprising:
   a first gain path coupled to the amplifier input portion;
   a second gain path coupled to the amplifier input portion in parallel with the first gain path, the second gain path including an appllification component to amplify the input signal, the amplification component having a selectively enabled RF low impedance termination to ground;
   a combiner coupled to the first and second gain paths, and having circuitry that combines the first and second gain paths to provide the output signal, the combiner comprising an impedance transformation network coupled to the power transistor, the impedance transformation network being responsive to a RF low impedance to present a high impedance; and
   an RF switch comprising the amplification component and the impedance transformation network, the RF switch being responsive to the control signal to selectively enable and disable the second gain path, by disabling and enabling the RF low impedance termination to ground, respectively.

7. The multi-mode amplifier of claim 6, wherein the amplification component comprises a radio frequency power transistor coupled to the amplifier input portion.

8. The multi-mode amplifier of claim 7, further comprising a pass transistor coupled to the radio frequency power transistor.

9. The multi-mode amplifier of claim 7, wherein the impedance transformation network comprises a quarter wavelength transmission line.

10. A multi-mode power amplifier having an amplifier input portion for providing an input signal, and an amplification stage responsive to a control signal to select between first and second operation modes to provide an amplified output signal, the amplification stage comprising:
   a first gain path coupled to the amplifier input portion;
   a second gain path coupled to the amplifier input portion in parallel with the first gain path, the second gain path including a power transistor to amplify the input signal, the power transistor being coupled to the amplifier input portion;
   a combiner coupled to the first and second gain paths, and having circuitry that combines signals from the first and second gain paths to provide the amplified output signal in the first operation mode, the combiner comprising an impedance transformation network coupled to the power transistor, the impedance transformation network being responsive to a RF low impedance to present a high impedance; and
   a RF low impedance termination to electrical ground selectively coupled at the power transistor and responsive to the control signal to select the second operation mode.

11. A multi-mode power amplifier responsive to a control signal to select between first and second operation modes to provide an amplified output signal, comprising:

a first amplification stage providing an input signal;

a second amplification stage coupled to the first amplification stage, the second amplification stage comprising:

first and second gain paths coupled in parallel to the first amplification stage, each of the first and second gain paths comprising:

a power transistor to amplify the input signal, the power transistor being coupled to the first amplification stage; and a impedance transformation network coupled to the power transistor;

a pass transistor coupled to the power transistors of the first and second gain paths to provide a direct current bias;

wherein the impedance transformation network of the first gain path and the second gain path are electrically coupled at a common node to form a combiner that combines the first and second gain paths; and a RF low impedance termination to electrical ground selectively coupled to the impedance transformation network of the first gain path to present a high impedance at the common node;

wherein the RF low impedance termination to ground, and the power transistor of the first gain path together operate as an RF switch, responsive to the control signal, to disable the first gain path thereby selecting between first and second operation modes.

12. The multi-mode power amplifier of claim 11, wherein for each of the first and second gain paths, the impedance transformation network comprises a quarter wavelength transmission line.

13. The multi-mode power amplifier of claim 11, wherein the combiner combines outputs from the power transistors of the first and second gain paths to provide the amplified output signal when the control signal selects the first operation mode.

14. The multi-mode power amplifier of claim 13, wherein the combiner presents output from the power transistor of the second gain path, but not from the first gain path, when the control signal selects the second operation mode.

* * * * *